United States Patent
Yang et al.

(10) Patent No.: US 7,405,595 B2
(45) Date of Patent: Jul. 29, 2008

(54) HIGH-SIDE TRANSISTOR DRIVER HAVING POSITIVE FEEDBACK FOR IMPROVING SPEED AND POWER SAVING

(75) Inventors: Ta-yung Yang, Milpitas, CA (US); Chuh-Ching Li, Jhongli (TW); Yu-Min Chen, Guishan Shiang (TW)

(73) Assignee: System General Corp., Taipei Hsien (TW)

( * ) Notice: Subject to any disclaimer, the term of this patent is extended or adjusted under 35 U.S.C. 154(b) by 15 days.

(21) Appl. No.: 11/281,685

(22) Filed: Nov. 16, 2005

(65) Prior Publication Data

US 2007/0109020 A1 May 17, 2007

(51) Int. Cl.
*H03K 19/094* (2006.01)
*H03K 19/0175* (2006.01)

(52) U.S. Cl. ............... 326/83; 326/88; 326/92
(58) Field of Classification Search ............ 327/108, 327/109, 112, 390; 326/83, 82, 85, 87, 88, 326/91, 92
See application file for complete search history.

(56) References Cited

U.S. PATENT DOCUMENTS

| | | | |
|---|---|---|---|
| 5,381,044 A | 1/1995 | Zisa et al. | 327/109 |
| 5,638,025 A | 6/1997 | Johnson | 330/225 |
| 5,672,992 A | 9/1997 | Nadd | 327/390 |
| 6,344,959 B1 | 2/2002 | Milazzo | 361/92 |
| 6,781,422 B1 * | 8/2004 | Yang | 327/108 |
| 6,836,173 B1 | 12/2004 | Yang | 327/390 |
| 2006/0164867 A1 * | 7/2006 | Dikken et al. | 363/13 |

* cited by examiner

*Primary Examiner*—Rexford Barnie
*Assistant Examiner*—Crystal L Hammond
(74) *Attorney, Agent, or Firm*—J.C. Patents

(57) ABSTRACT

A high-side transistor driver including a driver circuit for generating a driving signal to drive a high-side transistor is provided. A floating supply terminal provides a supply voltage to the driver circuit. A floating ground terminal is connected to a source of the high-side transistor. A bootstrap diode is coupled between the floating supply terminal and a voltage source. A capacitor is connected to the bootstrap diode and is coupled between the floating supply terminal and the floating ground terminal. A high-voltage transistor is used for switching off the driving signal and the high-side transistor in response to an input signal. A speed-up capacitor is coupled to the driver circuit for speeding up the driving signal. Furthermore, the positive feedback circuits in the driver circuit further accelerate the driving signal and save power for the driver circuit.

16 Claims, 3 Drawing Sheets

HIGH-SIDE TRANSISTOR DRIVER HAVING POSITIVE FEEDBACK FOR IMPROVING SPEED AND POWER SAVING

BACKGROUND OF THE INVENTION

1. Field of the Invention

The present invention relates to a high-side switch driver, and more particularly to a driver circuit for driving the high-side transistor.

2. Description of the Related Art

A variety of power converters and motor drivers utilize bridge circuits for controlling a power source to a load. The bridge circuit generally has a high-side switch coupled to a power source and a low-side switch coupled to a ground reference. A common node between the high-side switch and the low-side switch is coupled to a load. High-side and low-side switches are generally embodied in transistors. As switches are controlled to alternately conduct, the level at the common node is swung between the power source and the ground reference. Therefore, the level at the common node is shifted to the power source when the high-side transistor is turned on. In order to fully turn on the high-side transistor for achieving lower impedance, a gate driving voltage must be higher than the power source. Therefore the gate-to-source of the high-side transistor must be floated with respect to the ground reference. FIG. 1 illustrates a conventional bridge circuit using a bootstrap capacitor 30 and a charge-pump diode 40 for creating a floating voltage $V_{CC}$ for driving a gate of the high-side transistor 10. When a control transistor 45 is turned on, the gate of the high-side transistor 10 is therefore connected to the ground reference via a diode 42. This turns off the high-side transistor 10. Once the high-side transistor 10 is turned off and a low-side transistor 20 is turned on, the bootstrap capacitor 30 is then charged up by a bias voltage $V_B$ via the charge-pump diode 40. The floating voltage $V_{CC}$ is propagated to the gate of the high-side transistor 10 by switching off a control transistor 45 via a transistor 41. The high-side transistor 10 is turned on as a result of the aforementioned switching off of a control transistor 45.

One drawback of the aforementioned bridge circuit is its high switching losses in high-voltage applications. The control transistor 45 requires a high voltage manufacturing process suitable for high-voltage applications (at 200 volts or more). The high-voltage transistors typically have a larger parasitic capacitor, which increases the rising-time and therefore slows down the switching signal. High switching losses from the high-side transistor is resulted from the aforementioned bridge circuit. Therefore, the aforementioned bridge circuit is inadequate for high-voltage and high-speed applications.

Many recently developed bridge circuit designs include methods of generating a suitable gate-voltage for the high-side transistor. Some well-known conventional bridge circuit designs include Zisa et al. (U.S. Pat. No. 5,381,044), Johnson (U.S. Pat. No. 5,638,025), and Nadd (U.S. Pat. No. 5,672,992). The aforementioned bridge circuits share the same drawbacks as the conventional circuit shown in FIG. 1. The control transistors of the conventional bridge circuit designs produce high switching losses in high-voltage applications.

To overcome some the aforementioned deficiencies, a conventional bridge circuit using a boost converter technique was introduced by Milazzo (U.S. Pat. No. 6,344,959). However, the aforementioned technique uses a voltage doubling circuit, which requires an additional switching element and other circuitries; therefore, costs and complexities of the driving circuit are increased. Other conventional high-side transistor drivers for high-speed applications are described in Yang (U.S. Pat. No. 6,781,422) and in Yang (U.S. Pat. No. 6,836,173). However, the higher power consumption remains to be a disadvantage.

The objective of the present invention is to overcome the drawbacks of the conventional bridge circuits and to provide a high-side transistor driver having high efficiency suitable for high-voltage and high-speed applications.

SUMMARY OF THE INVENTION

A high-side switch driver according to the present invention includes a driver circuit having a positive feedback circuit to drive the high-side switch in response to an input signal. A first terminal and a second terminal are used for providing a supply voltage to the driver circuit. A first diode is coupled between the first terminal and a voltage source. A first capacitor is coupled to the first terminal and the second terminal to store the energy for powering to the driver circuit. A first switch switches off the high-side switch in response to the input signal. A second capacitor accelerates the driving of the high-side switch in response to the input signal. A first device is coupled to a second switch for pulling up the first switch. The second switch forms a positive feedback circuit for varying the impedance of the first device in response to the input signal. A third switch is connected to the first switch. The first switch controls the on/off of the third switch. A second device is coupled to the third switch. A third device is connected to the second switch and the third switch for providing the termination to the second switch. An output circuit having an input is coupled to the third switch. An output of the output circuit is coupled to drive the high-side switch.

The high-side switch driver according to the present invention introduces a method for driving the high-side switch in high-voltage and high-speed applications. Moreover, the efficiency of the high-side switch driver is improved. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention.

DESCRIPTION OF THE EMBODIMENTS

Figure 1:
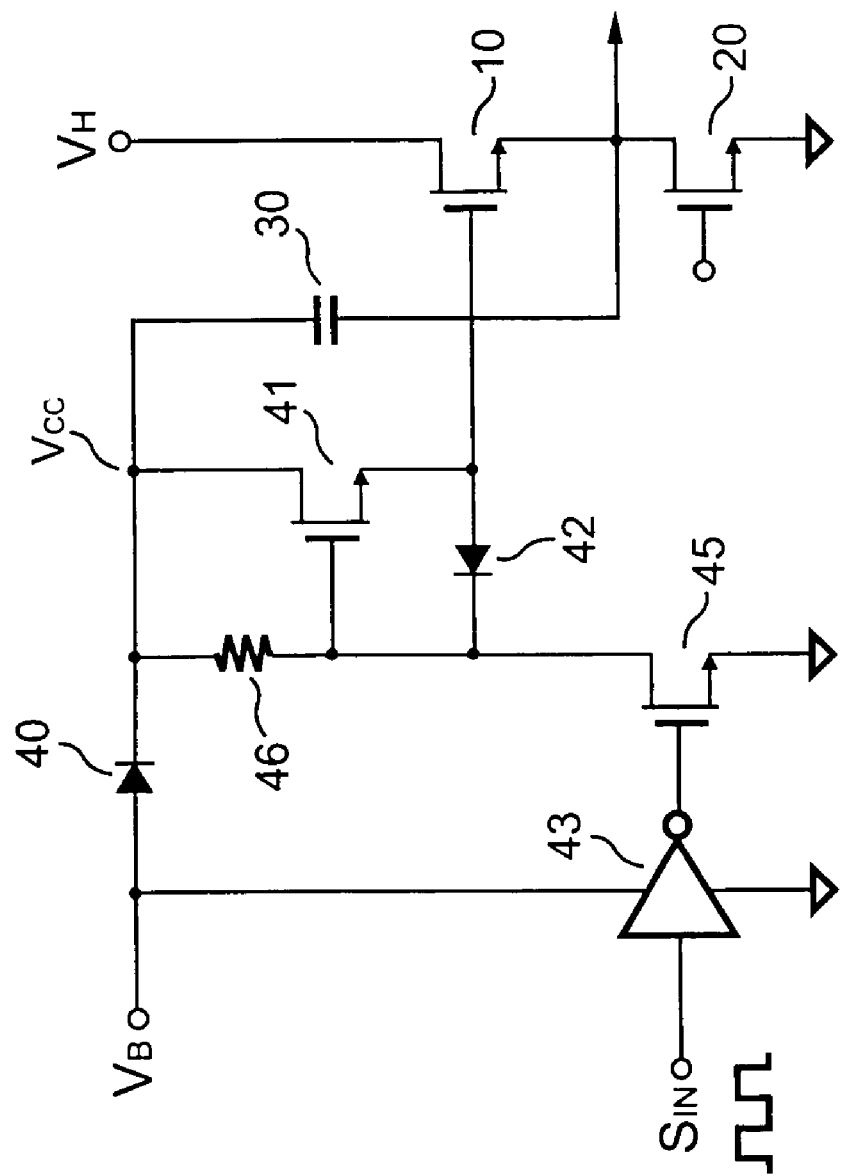
FIG. 1 is a circuit diagram illustrating a conventional high-side transistor driver.
Figure 2:
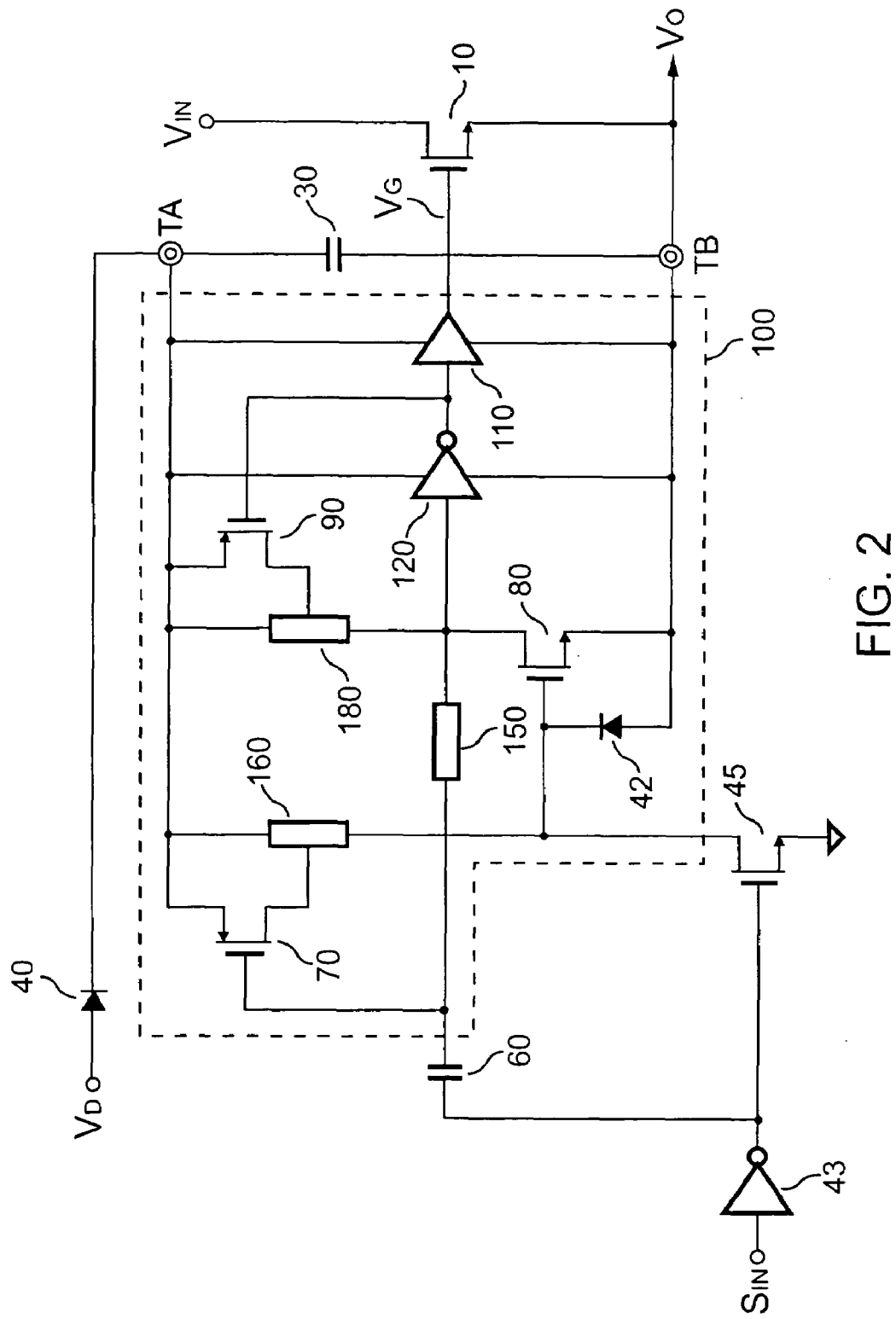
FIG. 2 is a circuit diagram illustrating a high-side transistor driver, according to an embodiment of the present invention.

FIG. 2 illustrates a circuit of a high-side transistor driver including a driver circuit 100 for receiving an input signal $S_{IN}$ and for generating a driving signal $V_G$ to drive a high-side transistor 10, according to an embodiment of the present invention. A first terminal TA and a second terminal TB provide a supply voltage to the driver circuit 100. The second terminal TB is connected to a source of the high-side transistor 10. A diode 40 is coupled between the first terminal TA and a voltage source $V_D$. A capacitor 30 is coupled between the first terminal TA and the second terminal TB to store the energy for the driver circuit 100. The voltage source $V_D$ charges the capacitor 30 once the input signal $S_{IN}$ is off. A transistor 45 is used for switching off the high-side transistor 10 in response to the input signal $S_{IN}$. The input signal $S_{IN}$ is supplied to a gate of the transistor 45 via an inverter 43. An output of the inverter 43 is further connected to a capacitor 60. The capacitor 60 is coupled to the driver circuit 100 for speeding up the driving signal $V_G$ in response to the input signal $S_{IN}$. The driver circuit 100 includes a positive feedback circuit to accelerate the driving signal $V_G$ and the power saving of the driver circuit 100.

The driver circuit 100 includes a first device 160 coupled from the first terminal TA to a drain of the transistor 45 for pulling up the transistor 45. A transistor 70 is coupled to the first device 160 to form a first positive feedback circuit. A gate of the transistor 70 is coupled to the capacitor 60 to reduce the impedance of the first device 160 in response to the input signal $S_{IN}$. As the input signal $S_{IN}$ is enabled, the transistor 45 is turned off via the inverter 43 and the transistor 70 is turned on via the inverter 43 and the capacitor 60. When the transistor 70 is turned on, the impedance of the first device 160 will be reduced and the drain of the transistor 45 will be promptly pulled up. A gate of a transistor 80 is coupled to the drain of the transistor 45. A source of the transistor 80 is connected to the second terminal TB. A diode 42 is connected in parallel between the gate and the source of the transistor 80. Once the input signal $S_{IN}$ is off, the transistor 45 is turned on. Therefore, the voltage source $V_D$ charges the capacitor 30 via the diodes 40, 42 and the transistor 45. A second device 180 is coupled to the first terminal TA and a drain of the transistor 80 for pulling up the drain of the transistor 80. A third device 150 is coupled to the gate of the transistor 70 and the drain of the transistor 80 for providing the termination to the gate of the transistor 70. An output circuit includes a buffer 110 and an inverter 120. An input of the output circuit is coupled to the drain of the transistor 80. An output of the output circuit generates the driving signal $V_G$ for driving the high-side transistor 10. A transistor 90 is coupled to the second device 180 for forming a second positive feedback circuit. The transistor 90 having a gate is coupled to the output circuit for reducing the impedance of the second device 180 in response to the driving signal $V_G$. When the transistor 80 has been pulled low to enable the driving signal $V_G$, the transistor 90 will be turned off to increase the impedance of the second device 180 and to save the power of the drive circuit 100.

Figure 3:
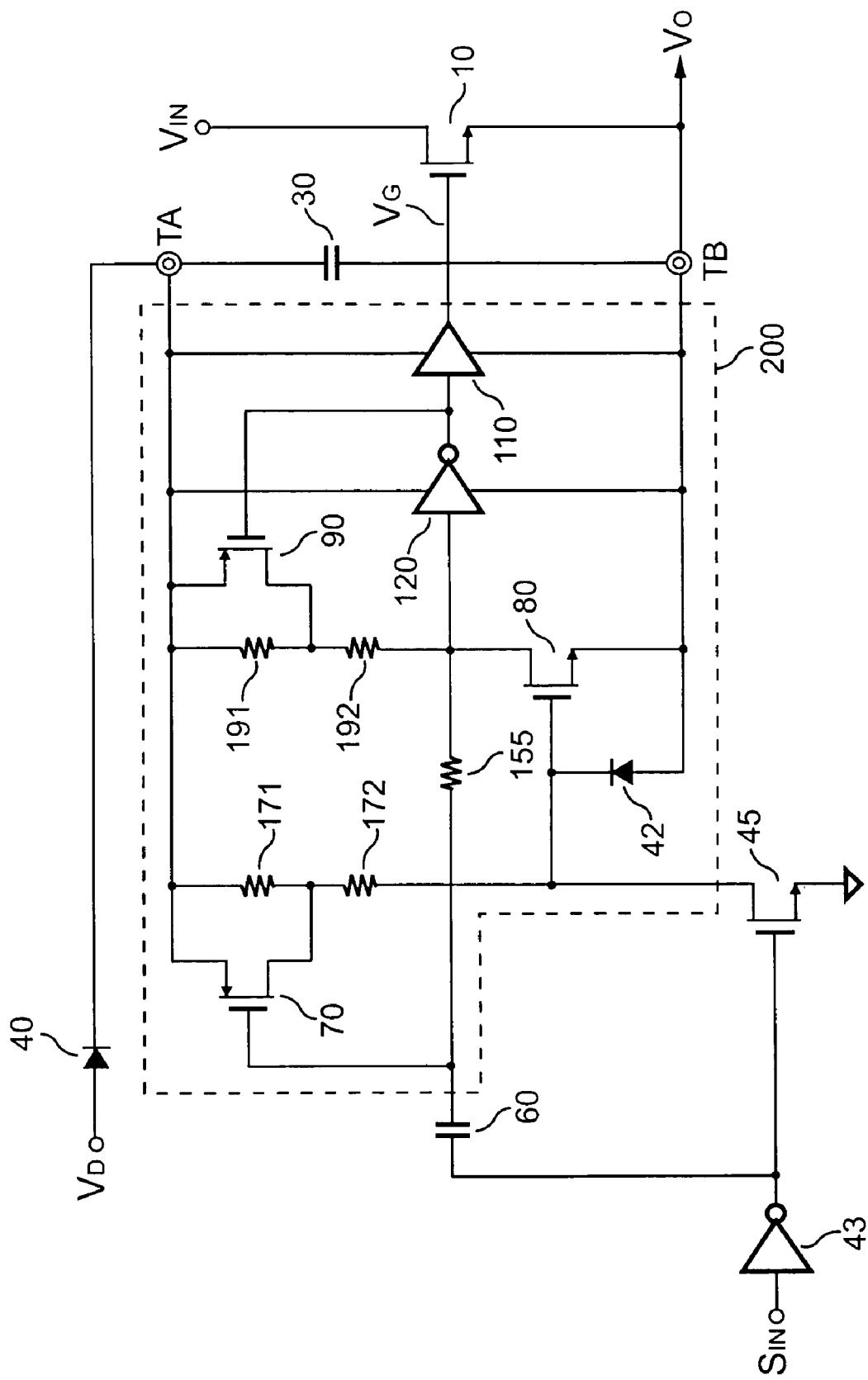
FIG. 3 is a circuit diagram illustrating a high-side transistor driver, according to another embodiment of the present invention.

Referring to FIG. 2, a high-side transistor driver according to another embodiment of the present invention is illustrated in FIG. 3. The resistors 171 and 172 are embodiments to form the first device 160. The Resistors 191 and 192 are embodiments to form the second device 180. A resistor 155 is an embodiment of the third device 150. Transistors 70 and 90 are used for shorting the resistors 171 and 191 respectively for varying the impedance. The high-side transistor driver in FIG. 3 according to another embodiment of the present invention overcomes the drawbacks of the conventional high-side transistor drivers, and is suitable for high-voltage and high-speed applications. Furthermore, the high-side transistor driver according to another embodiment of the present invention operates more efficiently than the conventional high-side transistor drivers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims or their equivalents.

What is claimed is:

1. A high-side transistor driver with high-speed high-side transistor driving, comprising:
    a driver circuit, receiving an input signal and generating a driving signal to drive a high-side transistor;
    a first terminal and a second terminal, providing a supply voltage to said driver circuit;
wherein said second terminal is coupled to a source of said high-side transistor;
    a first diode, coupled between said first terminal and a voltage source;
    a first capacitor, coupled between said first terminal and said second terminal for storing energy for said driver circuit;
    a first transistor, coupled for switching off said high-side transistor in response to said input signal; and
    a second capacitor, coupled to said driver circuit for speeding up said driving signal in response to said input signal;
    wherein said driver circuit includes a positive feedback circuit for accelerating said driving signal and for power saving of said driver circuit.

2. The high-side transistor driver of claim 1, wherein said voltage source charges said first capacitor once said input signal is off.

3. The high-side transistor driver of claim 1, wherein said driver circuit further comprises:
    a first device, coupled between said first terminal and a drain of said first transistor;
    a second transistor, coupled to said first device for forming a first positive feedback circuit;
wherein a gate of said second transistor is coupled to said second capacitor for reducing the impedance of said first device in response to said input signal;
    a third transistor, wherein a gate of said third transistor is coupled to said drain of said first transistor; and a source of said third transistor is connected to said second terminal;
    a second device, coupled between said first terminal and a drain of said third transistor;
    a third device, coupled between said gate of said second transistor and a drain of said third transistor for providing the termination to said gate of the second transistor;
    an output circuit, having an input coupled to said drain of said third transistor, wherein an output of said output circuit generates said driving signal to drive said high-side transistor;
    a fourth transistor, coupled to said second device for forming a second positive feedback circuit; wherein a gate of the fourth transistor is coupled to said output circuit for reducing the impedance of said second device in response to said driving signal; and
    a second diode, coupled in parallel between said gate and said source of said third transistor.

4. The high-side transistor driver of claim 3, wherein said first device comprises a plurality of resistors in series, and said second transistor is coupled to a node between said plurality of resistors.

5. The high-side transistor driver of claim 3, wherein said second device comprises a plurality of resistors in series, and said fourth transistor is coupled to a node between said plurality of resistors.

6. The high-side transistor driver of claim 1, wherein said positive feedback circuit comprises:

a first device, coupled between said first terminal and a drain of said first transistor; and a second transistor, coupled to said first device, wherein a gate of said second transistor is coupled to said second capacitor for reducing the impedance of said first device in response to said input signal.

7. The high-side transistor driver of claim 6, wherein said first device comprises a plurality of resistors in series, and said second transistor is coupled to a node between said plurality of resistors.

8. A high-side switch driver for driving a high-side switch, comprising:

a driver circuit, having a positive feedback circuit for driving said high-side switch in response to an input signal;

a first terminal and a second terminal, providing a supply voltage to said driver circuit;

a first diode, coupled between said first terminal and a voltage source;

a first capacitor, coupled between said first terminal and said second terminal;

a first switch, for switching off said high-side switch in response to said input signal; and a second capacitor, for speeding up driving said high-side switch in response to said input signal.

9. The high-side switch driver of claim 8, wherein said voltage source charges said first capacitor once said input signal is off.

10. The high-side switch driver of claim 8, wherein said driver circuit comprises:

a first device, coupled to said first switch;

a second switch, forming a positive feedback circuit for varying the impedance of said first device in response to said input signal;

a third switch, coupled to said first switch, wherein said first switch turns on/off said third switch;

a second device, coupled to said third switch;

a third device, coupled between said second switch and said third switch for providing the termination to said second switch; and an output circuit, having an input coupled to said third switch, wherein an output of said output circuit is coupled for driving said high-side switch.

11. The high-side switch driver of claim 10, wherein said driver circuit further comprises:

a fourth switch, coupled to said second device to form a positive feedback circuit for varying the impedance of said second device in response to said output of said output circuit.

12. The high-side switch driver of claim 10, wherein said driver circuit further comprises a second diode coupled to said third switch.

13. The high-side switch driver of claim 10, wherein said first device comprises a plurality of resistors in series, and said second switch is coupled to a node between said plurality of resistors.

14. The high-side switch driver of claim 10, wherein said second device comprises a plurality of resistors in series, and said fourth switch is coupled to a node between said plurality of resistors.

15. The high-side switch driver of claim 8, wherein said positive feedback circuit comprises:

a first device, coupled between said first terminal and a terminal of said first switch; and a second switch, coupled to said first device, wherein a control terminal of said second switch is coupled to said second capacitor for reducing the impedance of said first device in response to said input signal.

16. The high-side switch driver of claim 15, wherein said first device comprises a plurality of resistors in series, and said second switch is coupled to a node between said plurality of resistors.

* * * * *